(12) United States Patent
Akiyama et al.

(10) Patent No.: US 6,450,288 B1
(45) Date of Patent: Sep. 17, 2002

(54) AIR-CONDITIONING APPARATUS, PARTITION AND EXPOSURE APPARATUS

(75) Inventors: Kyoichi Akiyama; Gentoku Kou, both of Chiba; Makoto Ogawa, Hiratsuka; Masaru Hachisuka, Mito; Takashi Ozaki; Yoshinori Ogawa, both of Kumagaya; Isamu Takeuchi, Niihari-gun, all of (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/628,320

(22) Filed: Jul. 28, 2000

Related U.S. Application Data

(63) Continuation of application No. PCT/JP99/00345, filed on Jan. 27, 1999.

(30) Foreign Application Priority Data

Jan. 28, 1998 (JP) ............................................. 10-015884

(51) Int. Cl.7 .................................................. G10K 1/04
(52) U.S. Cl. ........................... 181/200; 181/292; 355/53
(58) Field of Search ................................. 181/292, 290, 181/286, 200, 201, 202, 203, 204, 205, 287, 207; 355/53, 67; 62/296

(56) References Cited

U.S. PATENT DOCUMENTS

| | | | | |
|---|---|---|---|---|
| 4,174,020 A | * | 11/1979 | Challis | ........................ 181/292 |
| 4,522,859 A | * | 6/1985 | Blair | ......................... 181/292 |
| 4,690,528 A | | 9/1987 | Tanimoto et al. | |
| 4,849,276 A | * | 7/1989 | Bendig et al. | ............... 181/292 |
| 4,989,031 A | | 1/1991 | Kamiya | |
| 5,691,806 A | * | 11/1997 | Tokuda et al. | ................. 355/53 |
| 5,877,843 A | | 3/1999 | Takagi et al. | |
| 6,002,987 A | | 12/1999 | Kamiya et al. | |
| 6,148,631 A | * | 11/2000 | Watanabe et al. | .............. 62/296 |
| 6,208,408 B1 | * | 3/2001 | Takabayashi | ................. 355/67 |

FOREIGN PATENT DOCUMENTS

| | | |
|---|---|---|
| JP | 54-013301 | 1/1979 |
| JP | 57-194506 | 11/1982 |
| JP | 59-120212 | 8/1984 |
| JP | 61-207747 | 9/1986 |
| JP | 2-199814 | 8/1990 |
| JP | 3-096507 | 4/1991 |
| JP | 4-189982 | 7/1992 |
| JP | 4-303897 | 10/1992 |
| JP | 5-307394 | 11/1993 |
| JP | 6-045227 | 2/1994 |
| JP | 7-012291 | 1/1995 |
| JP | 9-082625 | 3/1997 |
| JP | 9-260279 | 10/1997 |
| JP | 9-265137 | 10/1997 |

* cited by examiner

*Primary Examiner*—Khanh Dang
(74) *Attorney, Agent, or Firm*—Oblon, Spivak, McClelland, Maier & Neustadt, P.C.

(57) ABSTRACT

An exposure apparatus capable of minimizing low-frequency noise intruding into a chamber from the outside, wherein a partition of the chamber comprises a structure formed by sandwiching a ceramic honeycomb structural material (18) between a pair of steel or aluminum plates (16), the partition having a very high sound-proofing effect against low-frequency noise owing to its rigidity.

19 Claims, 7 Drawing Sheets

AIR-CONDITIONING APPARATUS, PARTITION AND EXPOSURE APPARATUS

This application is a continuation of PCT/JP99/00345 filed Jan. 27, 1999.

FIELD OF THE INVENTION

The present invention relates to an air-conditioning apparatus useful for temperature controlling of a machine tool, a measuring apparatus or an exposure apparatus for use in fabricating a semiconductor device, and also relates to a partition for use in the air-conditioning apparatus and an exposure apparatus equipped with the air-conditioning apparatus and the partition.

BACKGROUND OF THE INVENTION

In the currently used ultra-high-precision machine tools and measuring apparatuses (e.g., an interferometer), very high working accuracy and measurement accuracy are often required. To meet the requirement of such very high accuracy, careful consideration must be taken to the entire arrangement and constitution of the apparatus, as well as the environment where the apparatus is placed. In particular, the change in temperature of the environment apparently affects the accuracy of the apparatus to a great extent. Accordingly, it is required to prevent the temperature variation in the environment to a minimum to achieve ultra-high-precision working accuracy and measurement accuracy. In general, a high accuracy of the apparatus can be achieved by placing and operating the apparatus in a constant temperature room where the room temperature is controlled. However, for an apparatus in which a still higher accuracy is required and therefore a precise temperature control in the environment when the apparatus is placed is needed, the accuracy can be achieved by providing a chamber for the apparatus and precisely controlling the temperature of the interior of the chamber by means of an air-conditioner installed outside of the chamber.

The schematic illustration of a conventional air-conditioning apparatus used for the temperature control of an ultra-high-precision machine tool or measuring apparatus is shown in FIG. 4. FIG. 4 illustrates an example of a reduction projection exposure apparatus for use in the manufacture of an integrated circuit (IC), which comprises the main body of the reduction projection exposure apparatus, a chamber and an air-conditioning apparatus. A light or laser beam 4 emitted from a light source 3 which is placed in a case different from the chamber, is irradiated onto a reticle 6 on which a circuit pattern for the integrated circuit is formed. The light or laser beam 4 passed through the reticle 6 is incident to a projection lens 5, where the light or laser beam is converged (e.g., converged to ⅕) and then irradiated onto a silicon wafer 7 mounted on a wafer stage 8. The silicon wafer 7 is mounted on the wafer stage 8 and is configured to be movable on a plane perpendicular to the light axis of the projection lens 5 by means of a movement mechanism for the wafer stage 8 in accordance with a command output from an external device. Upon the alignment of the wafer stage 8 being completed, the light or laser beam 4 emitted from the light source 3 is irradiated onto the reticle 6 and then converged through the projection lens 5 to project the circuit pattern formed on the reticle 6 onto a chip or shot region on the silicon wafer 7, whereby a photosensitive agent applied on the chip or shot region on the silicon wafer 7 is exposed to the light or laser beam 4.

Upon the reduction projection exposure process being completed, the wafer stage 8 is driven again to be aligned. Then, the subsequent reduction projection exposure process is performed. In this manner, with the repeated alignment and exposure process, the circuit pattern for the IC is projected in reduced form onto the silicon wafer 7.

The reduction projection exposure apparatus is subjected to the change in temperature of the environment and the vibrations transmitted to the apparatus, resulting in the formation of uneven line widths. For the purpose of eliminating these causative factors as much as possible, the main body of the reduction projection exposure apparatus is mounted on a vibration isolation table 2 and the entire apparatus is housed in a chamber 9. The chamber 9 receives air 12 brown from an air-conditioner 10 which comprises an air-blower 13 (which serves both as an air-blower and an air exhauster) and a heat exchanger 11. The temperature-controlled air is fed into the chamber 9 via a duct 15 and a filter 14. The temperature in the chamber 9 is continuously monitored by a sensor. The signal output from the sensor is fed back into the air-conditioner 10 to control the air-conditioner 10 so that there is no difference between the actual temperature in the chamber 9 and the set temperature. The chamber 9 has a partition having high thermal insulating properties so that the temperature variation occurring outside of the chamber 9 gives no influence on the temperature inside of the chamber 9. A conventionally used partition is one having a cross-sectional structure as shown in FIG. 5. The partition consists of a rigid urethane foam 17 sandwiched by a pair of steel or aluminum plates 16. The partition is used for imparting a strength to the chamber, and also used primarily in expectation of its thermal insulating effect.

The main body of the reduction exposure apparatus in the chamber 9 is mounted on the vibration isolation table 2 which is mounted on an independent base 21 on the ground 20. The chamber 9 and the air-conditioner 10 are mounted on a floor member 23 which is supported by struts 22 on the ground 20. A cushioning material 24 is filled between the floor member 23 and the independent base 21.

The recent demand for ultra-high-precision in an apparatus has been increased to a level that cannot be achieved merely by the temperature control of the environment around the apparatus.

For example, the line width of an IC pattern required in such a reduction projection exposure apparatus as mentioned above is less than 0.35 $\mu$m. In the future, the reduction projection exposure apparatus would be expected to cover line widths around 0.25 $\mu$m and even around 0.15 $\mu$m. In this connection, even negligible disturbance factors that have been hitherto insignificant are increasingly becoming the topic, and the countermeasures against such disturbance factors should be taken.

What is consider as one of the disturbance factors is a noise transmitted to a chamber from the environment where the chamber is installed through a partition. In the case of a reduction projection exposure apparatus, a chamber typically is installed in a clean room. Noises generated in the clean room are transmitted to the partition of the chamber via air (as a medium), and transmitted in turn from the partition to the main body of the reduction projection exposure apparatus or the individual constituent parts (e.g., a projection lens, a stage and a wafer) to cause vibration thereof. As a result, there will be came up some problems, such as relative displacement among the individual constituent parts of the reduction projection exposure apparatus and difficulty in constantly maintaining a fine line width on the exposed plane.

The data of the noise levels measured both inside and outside of the chamber installed in a clean room is shown in FIG. 6. During the measurement, the air-conditioner which blows air into the chamber is stopped to detect only the noises intruding from the outside of the chamber. The partition of the chamber used is a conventional one having a cross-sectional constitution as shown in FIG. 5. As shown in the graphs of FIG. 6, even inside of the chamber, extremely low-frequency noises out of the audio range (i.e., low-frequency vibrations transmitted as compressional waves in air) are detected, which have sound pressure levels of about 69 dB at the maximum. It may suppose that the low-frequency noises are generated by a large air-blower for temperature-controlling the clean room and a duct which guides the temperature-controlled air into the chamber, and that the noises intruding into the clean room are transmitted to the chamber through the partition of the chamber. Comparing the noises with the date for the noise levels separately measured outside of the chamber, it can be found that, although the conventional partition exerts a satisfactory sound-proofing or noise-insulating effect against high-frequency noises having frequencies higher than about 60 Hz, it exerts less insulation effect on extremely low-frequency noises having frequencies of a few to several tens of Hz.

The influence of the noises in the interior of the chamber illustrated in FIG. 6 on the accuracy of the apparatus housed in the chamber is simulated taking the case where the main body of a reduction projection exposure apparatus is installed in the chamber. The results are shown below. The relationship between a sound pressure level (SPL) and a force per unit area generated by the sound pressure level is expressed by the following equation (1):

$$p = 10^x \times 10^{-1} \text{ (Pa)} \qquad (1)$$

wherein $X = (S-74)/20$;

P: a force acting on a unit area (Pa); and

S: a sound pressure level (dB).

The relation between a sound pressure level calculated in accordance with the equation (1) and an acceleration by vibration observed on a vibration isolation table 2 on which the main body of a reduction projection exposure apparatus is mounted, is shown in FIG. 7. The vibration isolation table 2 used is of an active-control type, and the calculation is made on the presumption that the vibration isolation table 2 has an attenuating ability of about −30 dB in a low frequency vibration range. From the noise measurement data shown in FIG. 6 and the calculated data shown in FIG. 7, it is considered that the acceleration by vibration observed on the vibration isolation table 2 on which the reduction projection exposure apparatus is mounted would be about 1 mgal at the maximum.

Under normal circumstances, a value "1 mgal" for the acceleration is considered to be very small which have little influence on the accuracy of an apparatus. However, in a reduction projection exposure apparatus by which micro-processing or micro-machining is to be performed, is of the significant meaning. Moreover, the acceleration of "1 mgal" is caused only by the noises in the chamber. In practice, vibrations transmitted from the ground 20 through an independent base 21 and so on are further added to the vibrations caused by the noises, which is a serious problem. Therefore, it is required to take some measures against this problem.

SUMMARY OF THE INVENTION

The air-conditioning apparatus according to the present invention includes a partition having a first plate member disposed on the side of an air-conditioned space which is conditioned by an air-conditioner and a second plate member disposed on the side of a space which is different from the air-conditioned space; the apparatus having a matrix material which is disposed between the first and second plate members; the matrix material comprising a plurality of cells each having a pair of side faces of a predetermined shape which face the first and second plate members, respectively.

The partition according to the present invention comprises a first plate member disposed on the side of an air-conditioned space and a second plate member disposed on the side of a space which is different from the air-conditioned space; the partition having a matrix material disposed between the first and second plate members; the matrix material comprising a plurality of cells each having a pair of side faces of a predetermined shape which face the first and second plate members, respectively.

The exposure apparatus according to the present invention comprises a main body of the exposure apparatus which transfers a pattern formed on an original plate onto a photosensitive substrate by exposure of light and a chamber which is provided around the main body to house the main body; the chamber having a first plate member which is disposed in the interior of the chamber, a second plate member which is disposed in the exterior of the chamber and a matrix material disposed between the first and second plate members; the matrix material comprising a plurality of cells each of which has a pair of side faces of a predetermined shape facing the first and second plate members, respectively, and which are disposed between the first and second plate members.

Each of the cells preferably comprises a hollow member having a pair of side faces of a predetermined shape, whereby weight of the cells can be reduced.

The matrix material preferably comprises a ceramic honeycomb structural material, whereby its rigidity is increased.

The air-conditioning apparatus according to the present invention comprises a chamber, a duct and an air-conditioner; the chamber having a partition which comprises a cellular material such as a honeycomb structural material.

The exposure apparatus having a chamber which houses the apparatus therein according to the present invention has a chamber partition which comprises a cellular material, such as a honeycomb structural material.

This specification includes part or all of the contents as disclosed in the specification and/or drawings of Japanese Application No. 10-15884, which is a document declaring a right of priority of the present application.

BEST MODE FOR CARRYING OUT THE INVENTION

According to the present invention, in the ultra-high-precision processing or measurement performed by a machine tool or measuring apparatus in which a high accuracy is required in a chamber where the inside air is kept clean and at a constant temperature, a partition having a sound-proofing effect (i.e., an effect on insulating low-frequency noises) is used as a partition of the chamber. The most of noises transmitted from the outside of the chamber is considered to be resulted from an air-conditioner for maintaining the temperature in a clean room or the like constant and a duct attached to the air-conditioner. Therefore, the higher the clean room becomes, the larger the conditioner and the duct becomes, leading to generation of low-frequency vibrations of ten-odd of Hz. Such low-frequency vibrations can pass through the large part of a conventional chamber partition made of rigid urethane foam. On the other hand, the natural frequency of vibration of the mechanically coupled part of an apparatus installed in a chamber, which is usually 100 Hz or lower, may produce resonance with the low-frequency noises intruding from the outside of the chamber to generate undesirable vibrations in the apparatus in the chamber, causing decrease in working accuracy and measurement accuracy. For these reasons, the sound-proofing or insulation of the low-frequency noises is very important for an apparatus in which accuracy is required.

It is generally said that it is effective to augment the weight of a partition in order to heighten the sound-proofing or noise-insulating effect. Therefore, the use of a thick partition made of concrete can be expected to provide a satisfactory sound-proofing effect. However, it is also said that, even for a partition made of concrete, a considerable thickness would be required to have an effect on insulating low-frequency noises having frequencies of about ten-odd of Hz. When an apparatus to be installed in a chamber is large, the chamber is usually set up after the apparatus is assembled. Therefore, it is difficult to manufacture a chamber having a considerably thick concrete-made partition (which is heavy in weight) outside of the apparatus from the viewpoints of safety and practicality.

Figure 6:
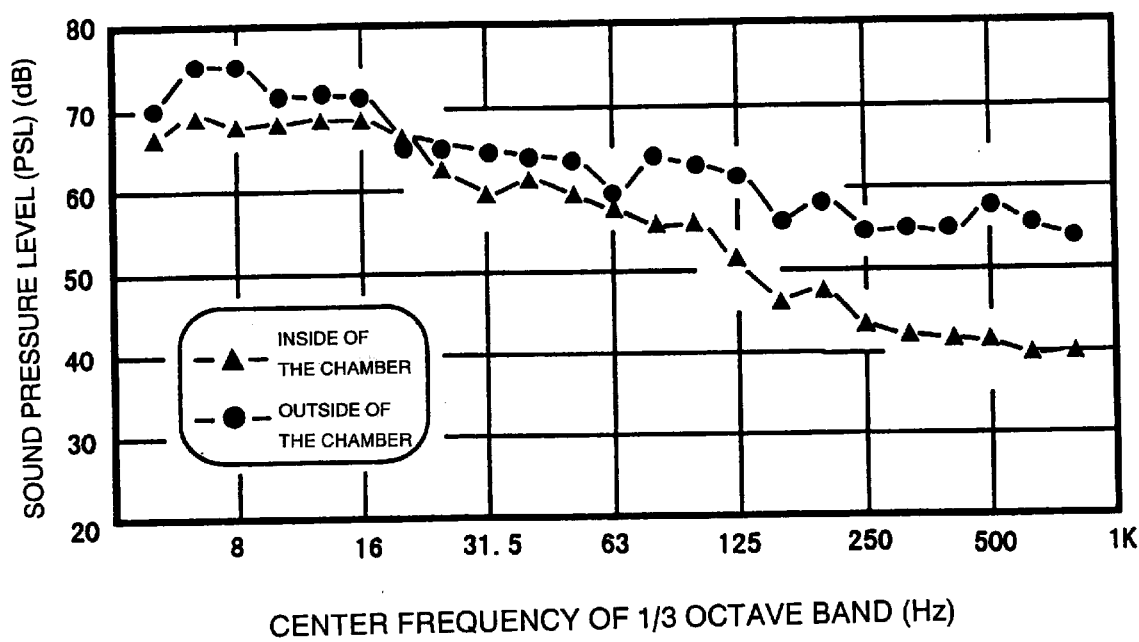
FIG. 6 is a graph showing the measurement results of the sound pressure level measured both inside and outside of a chamber having a prior art partition.
Figure 7:
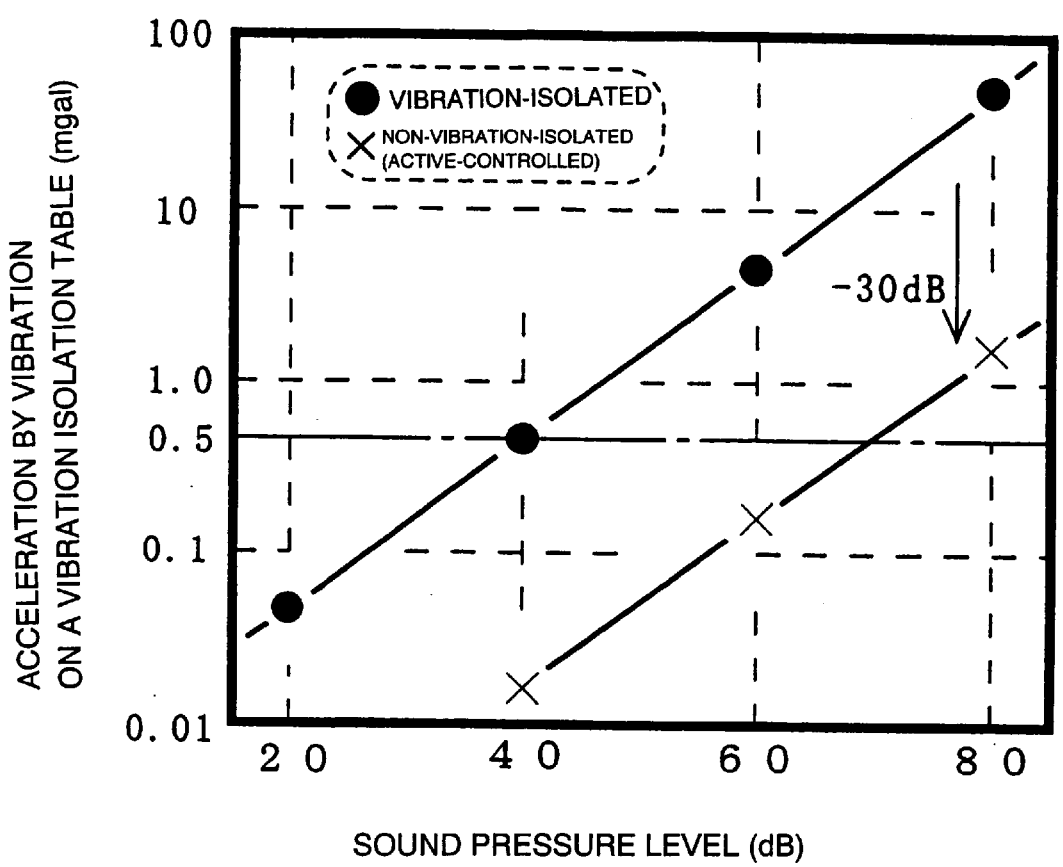
FIG. 7 is a graph showing the relationship (in terms of calculated values) between a sound pressure level and an acceleration by vibration observed on a vibration isolation table.

In a chamber to be used only in a clean room, most of the frequencies of the noises detected in the clean room apparently lie in the low frequency range, as shown in FIG. 6. Accordingly, if only low-frequency noises are insulated by a partition of the chamber, then the influence of the noises on the accuracy of the apparatus placed in the chamber could be largely reduced.

The present invention employs a configuration by which noises in the low frequency range can be insulated without augmenting the weight of the partition. It is demonstrated by the experimental results shown in FIG. 3 that increased rigidity of the partition enables to insulate noises in the low frequency range.

Hereinbelow, a specific example of the configuration will be explained.

Figures 1A, 1B:
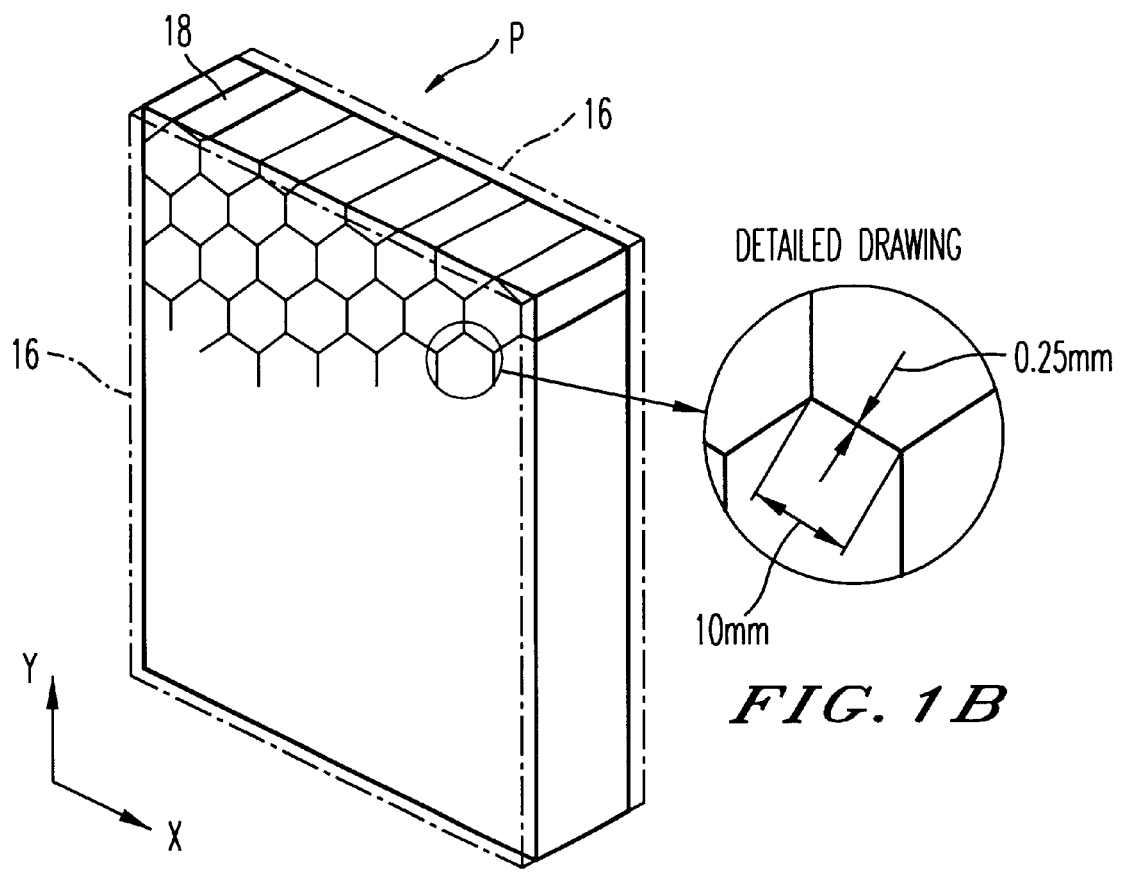
FIG. 1 is a perspective view of a partition of a chamber according to the present invention.
Figure 2:
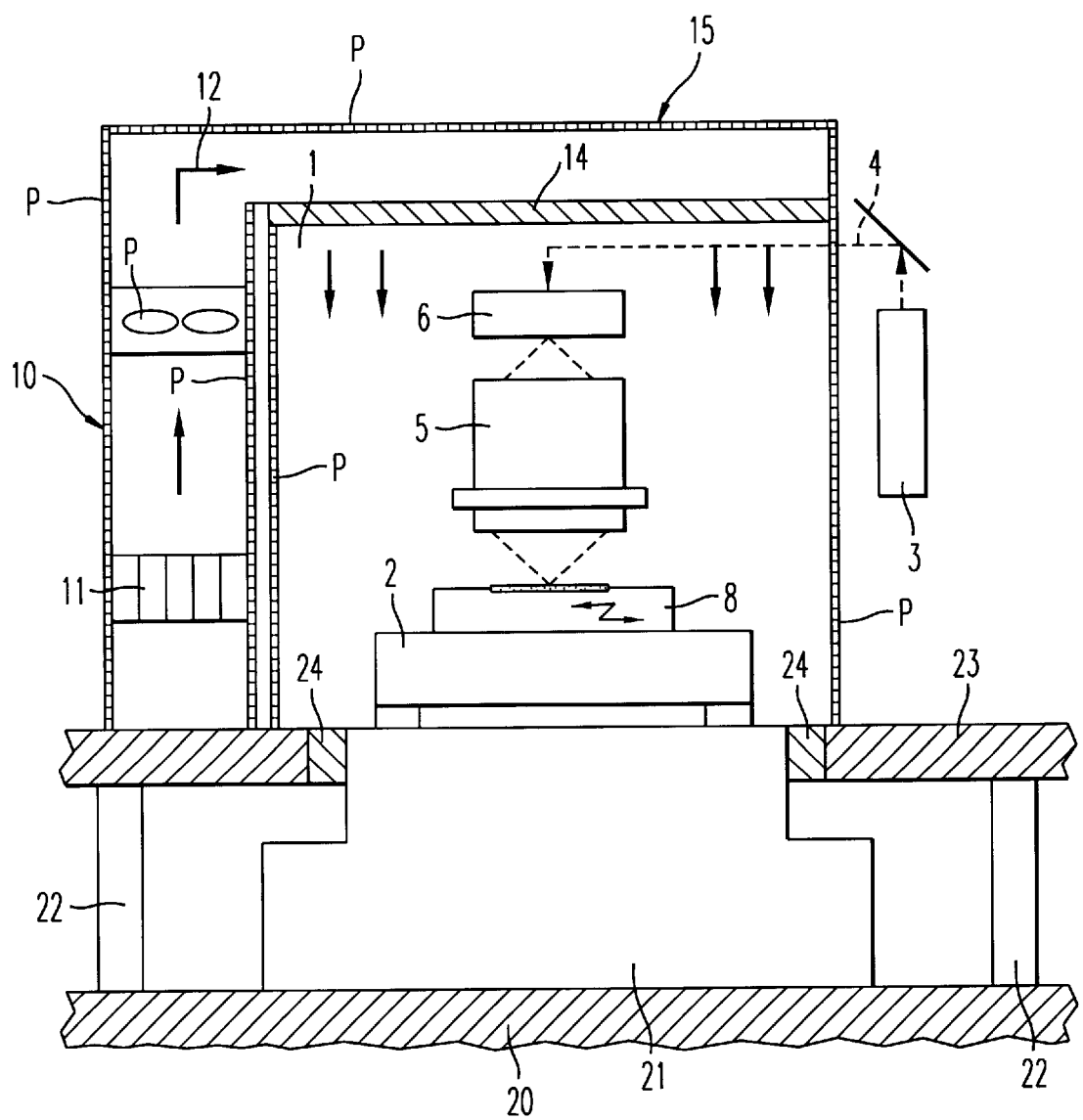
FIG. 2 is a schematic view of a reduction projection exposure apparatus having a chamber.
Figure 4:
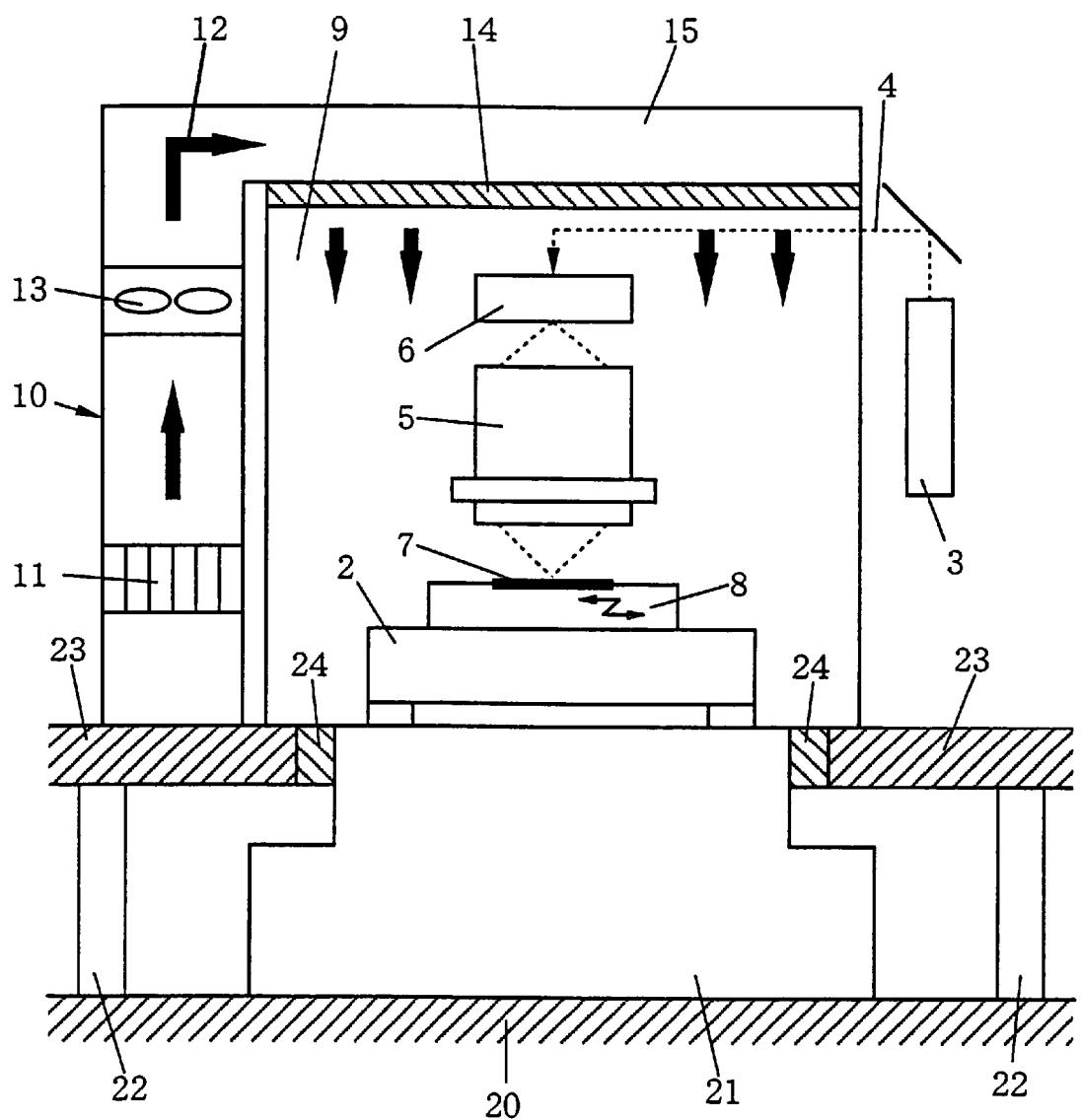
FIG. 4 is a schematic view of a reduction projection exposure apparatus having a prior art chamber.

FIG. 2 illustrates an embodiment of the present invention, in which the main body of a reduction projection exposure apparatus is of the same type as a conventional one as illustrated in FIG. 4. In the embodiment, a partition P shown in FIG. 1 is used as a partition of a chamber 1 and external panels for a duct 15 and an air-conditioner. As shown in FIG. 1, the partition P comprises a ceramic honeycomb structural material 18 (i.e., a matrix material) sandwiched by a pair of steel or aluminum plates 16 (i.e., first and second plates).

The honeycomb structural material 18 comprises a cellular material in which each cell or compartment has a cross section of a predetermined shape. Specifically, the honeycomb structural material 18 comprises an aggregate of prism-shaped tubes or cells each having a hexagonal cross section taken in the thickness-wise direction of the partition. For example, as shown in FIG. 1, each of the cells has an equilateral hexagonal cross section with a side length of about 10 mm and a cell wall thickness of about 0.25 mm. The size of the cell is not limited to this size, and may be larger or smaller than such a size. Since the individual cells are hollow when observed in the thickness-wise direction of the partition, the aggregate of the cells also referred to as a "porous plate". In each cell, the two hexagon-shaped hollow sides face the first and second plates, respectively. The cells are arranged in the directions to which the first and second plate extend (i.e., the X- and Y-directions) in a regularly repeating manner. It is preferable that the partition has an entire thickness of 30–60 mm, where the partition is not much bulky and a high rigidity can be achieved. The partition comprises a ceramic-made honeycomb structural material. An example of such a partition is Noncombustible Magne-Honeycomb Panel Model AW (Showa Aluminum Corporation).

Figure 3:
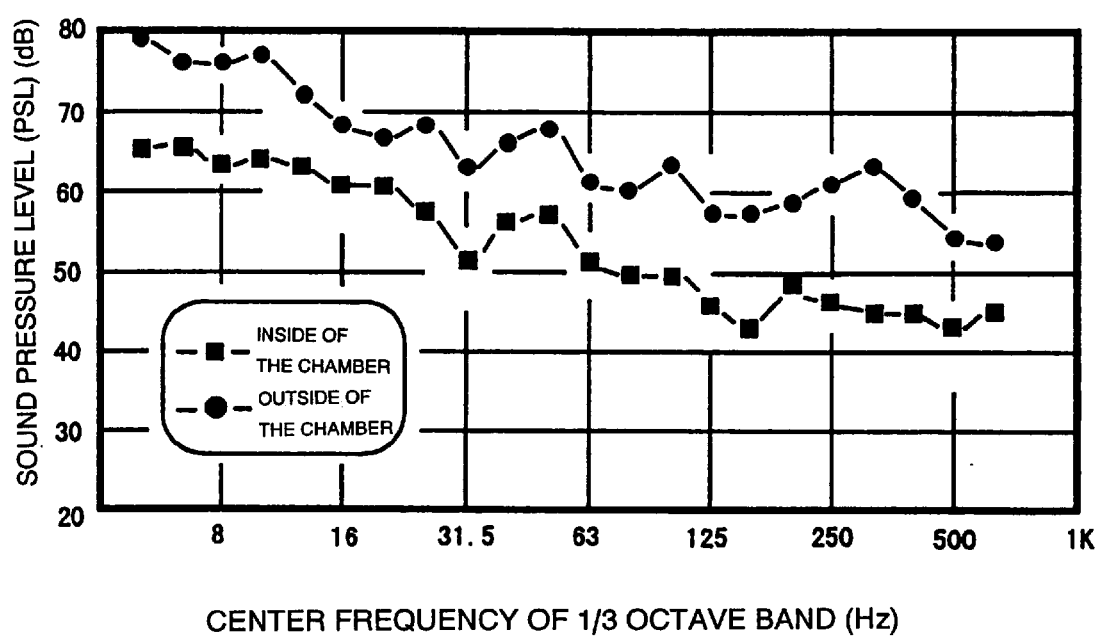
FIG. 3 is a graph showing the measurement results of the noise reduction effect.

A measuring apparatus for measuring noise levels is installed in the chamber of the embodiment. The measurement data of noise levels obtained by the measuring apparatus and the measurement data of noise levels detected outside of the chamber are shown in FIG. 3. As shown in FIG. 3, the chamber of the embodiment exerts a higher sound-proofing effect against noises in the lower frequency range than a conventional partition chamber which comprises a rigid urethane foam 17 sandwiched by steel plates.

As also shown in FIG. 3, according to the embodiment, it becomes possible to insulate low-frequency noises having frequencies ranging from 10 to 4 Hz, which affect the accuracy of the apparatus to a great extent, by about 6 to 12 dB. The use of the partition according to the embodiment enables to prevent the transmission of low-frequency noises in the clean room to the chamber 1 by the effect of the partition of the chamber 1, whereby the reduction in accuracy of the apparatus caused by the low-frequency noises can be prevented.

In the embodiment, although ceramic is exemplarily used as the material for the honeycomb structure, other material may be used, such as an alloy of aluminum. In particular, the use of ceramic as the material for the honeycomb structure can offer the advantages that light weight, high rigidity and non-combustibility of the partition. The use of a ceramic honeycomb structural material can provide a chamber having a rigidity enough to function as a chamber, for example a Young's modulus of about $15 \times 10^7$ N/m$^2$ even at a wall thickness of about 42 mm, which is about 10 times larger than a conventional urethane partition (which has a Young's modulus of about $15 \times 10^6$ N/m$^2$ at a wall thickness of about 44 mm). In other words, the honeycomb structural material of the embodiment has a bending (flexural) rigidity about 10 times larger than that of a conventional partition of a chamber. Accordingly, the use of the honeycomb structural material as a partition of a chamber can increase in rigidity of the chamber, and therefore an extremely high sound-proofing effect against noises in a low frequency range.

The partition according to the embodiment may be used only as the partition of the chamber 1.

A conventional projection exposure apparatus consists primarily of the following three components: a light source device, which houses therein a light source for emitting an exposure light; a light-transmission optical system, which guides the exposure light emitted from the light source device to the illumination optical system to be mentioned later; and the main body of the apparatus, which comprises the illumination optical system for illuminating a mask, a mask stage on which the mask is placed, a projection optical system which transfers a pattern formed on the mask onto a substrate, a wafer stage on which the substrate is placed and so on. The light source device is housed in a light source chamber; the light-transmission optical system is housed in a connection unit; and the main body of the apparatus is housed in a main body chamber.

Therefore, the partition according to the embodiment may be used in at least one of the light source chamber, the connection unit and the main body chamber. In a preferred embodiment, the partition is used in all of them.

The partition according to the embodiment is preferably used in the entire part of the chamber, but may be used in a part of the chamber.

In the embodiment, a partition having a highly rigid honeycomb structural material (a matrix material) is used, which is particularly effective against the noises in the low frequency range. However, the means for insulating noises is not limited to such a type. Each of the cells may have a hollow structure as mentioned above, or may be filled with a filling material. As the filling material, a sponge-like foam or resin may be preferably used. For example, a preferable example of the foam is a rigid or flexible polyurethane foam, and a preferable example of the resin is a rubber.

The cell may have a hollow structure as mentioned above, or the openings of the hollow structure of the cell may be closed to form an internal space. The hollow section or the internal space of the cell may be filled with a foam to provide a riddled matrix (i.e., a matrix having air holes therein), or may be filled up with a resin so that no air hole is formed. By employing such structure, it can be expected to achieve an improvement in thermal insulation and a more effective insulation of low-frequency noises.

Alternatively, the partition may be used in combination with a conventional partition to form a double- or triple-layer chamber partition. By employing such constitutions, it can be expected to achieve a sound-proofing effect against noises in the wide range of frequencies ranging from a still lower frequency to a frequency of the order of kHz.

Figure 5:
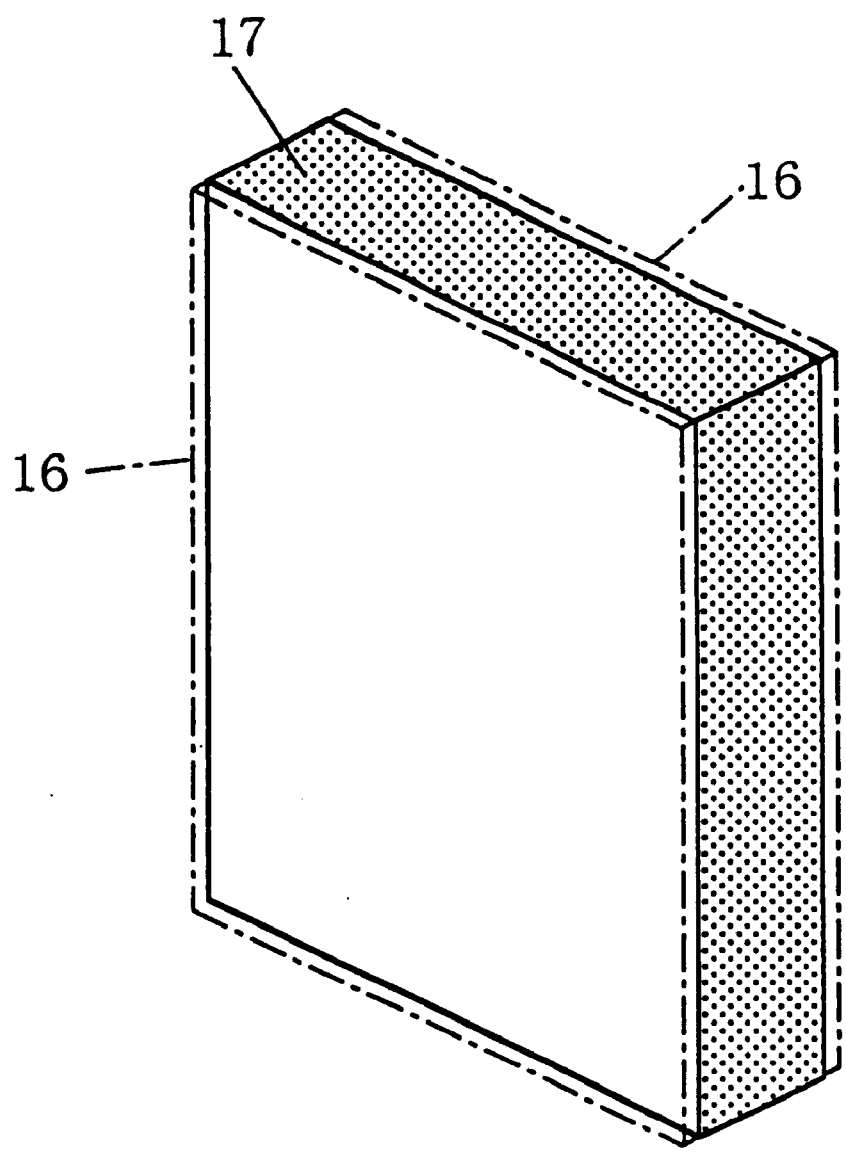
FIG. 5 is a perspective view of a prior art partition of a chamber.

That is, it is possible to combine a partition as shown in FIG. 5, which comprises a rigid urethane foam sandwiched by a pair of steel or aluminum plates, with a partition according to the embodiment, which comprises a honeycomb structural material sandwiched with a pair of steel or aluminum plates. It is also possible to combine a plurality of partitions of the embodiment to form, for example, a double- or triple-layer structure.

The partition of the embodiment has such a constitution that the side faces of a matrix material contact with a pair of steel or aluminum plates, respectively. However, the constitution is not limited to this type, and clearance may be created between the matrix material and each of the plates.

In the embodiment, the honeycomb structural material is a cellular material in which each cell has a hexagonal cross section. However, the cross section of the cell is not necessary to be hexagonal. For this reason, the term "cellular material" is used in the claims appended to the specification.

In the embodiment, an aggregate (i.e., a honeycomb structural material) of prism-shaped structures (i.e., cells) each having a hexagonal cross section is used in all of a partition of a chamber for an exposure apparatus, an external panel for an air-conditioning apparatus for supplying air into a chamber in which the exposure apparatus is housed and a partition of a duct provided between the air-conditioning apparatus and the chamber. However, the honeycomb structural material may be applicable to a component other than those mentioned in the embodiment. For example, the honeycomb structural material may be applied to a partition of an external separated room. The honeycomb structural material may also be applied to a partition between a room in which an air-conditioner is installed and a room which is conditioned by the air-conditioner.

The cell of the cellular material (i.e., a matrix material) according to the embodiment has a cross section of a hexagonal shape as mentioned above. However, the shape of the cross section is not limited to hexagonal, and may be polygonal (e.g., triangular, pentagonal or octagonal) or circular or oval. In the embodiment, although an aggregate of prism-shaped tubes (i.e., cells) each having a hexagonal cross section is exemplarily shown as the cellular material, the cellular material is not limited to such type of aggregate. For example, an aggregate of shells each of which encapsulates a filling material as mentioned above may be used. The material for forming the shells is preferably ceramic or an alloy of aluminum. The shape of the shell may be spherical or rectangular. In this case, the shell is preferably arranged in a regularly repeating manner, but may be arranged randomly.

As mentioned above, according to the embodiment, low-frequency noises which seem to be difficult to insulate and have a great influence on the accuracy of the apparatus can be insulated by about 6 to 12 dB. Accordingly, it is possible to reduce the acceleration by vibration on a vibration isolation table, which is caused by the noises, to the level of about ½ to $\frac{1}{10}$. Consequently, it becomes possible to yield the environment extremely favorable for a machine tool, a measuring apparatus (e.g., an interferometer) and a reduction projection exposure apparatus in which the precision level required is forecast to increase in the future.

Industrial Applicability

According to the present invention, it becomes possible to insulate noises in the low frequency range which cannot be insulated by a conventional partition.

What is claimed is:

1. An exposure apparatus comprising:
   a projection optical system disposed between an original plate having a pattern and a substrate to transfer the pattern on the original plate onto the substrate by exposure light;
   a substrate stage that holds the substrate, and
   a chamber which is provided on a floor member to surround a space which includes the original plate, the projection optical system, and the substrate stage, wherein said chamber suppresses a transmission of vibration from an exterior to an interior of said chamber;
   the chamber having a first plate member which forms the interior surface of the chamber;
   a second plate member which forms the exterior surface of the chamber; and
   a matrix material disposed between the first and second plate members; wherein the matrix material comprises a plurality of cells each of which has a pair of side faces of a predetermined shape facing the first and second plate members, respectively, and which are disposed between the first and second plate members.

2. The exposure apparatus according to claim 1, wherein the cells are made of a porous plate having a pair of side faces of a predetermined shape.

3. The exposure apparatus according to claim 1, wherein the matrix material is made of a ceramic honeycomb structural material.

4. An exposure apparatus according to claim 1, wherein said exposure apparatus has an air-conditioning apparatus which controls the environment in said chamber, and wherein a partition which defines said air-conditioning apparatus is formed of a honeycomb structure.

5. An exposure apparatus according to claim 4, wherein said honeycomb structure comprises an aluminum alloy or a ceramic material.

6. An exposure apparatus according to claim 1, wherein said vibration arises as a result of a noise of a low frequency from the exterior of said chamber, and said chamber attenuates the noise.

7. An apparatus according to claim 6, wherein a frequency of said noise is 60 Hz or less and said chamber reduces intensity of said noise by from 6 dB to 12 dB.

8. An apparatus according to claim 1, wherein said vibration arises as a result of a noise produced by an external apparatus installed on the exterior of said chamber, and said chamber attenuates the noise.

9. An apparatus according to claim 8, wherein said chamber is installed in a clean room in which the environment is controlled, and said external apparatus is at least one of the following:

(a) an air-conditioning apparatus that controls the environment in said clean room; and (b) a duct connected to an air-conditioning apparatus.

10. An exposure apparatus according to claim 1, wherein said vibration arises as a result of a noise of a low frequency from the outside of said chamber, and said chamber attenuates the noise.

11. An apparatus according to claim 10, wherein a frequency of said noise is 60 Hz or less and said chamber reduces intensity of said noise by from 6 dB to 12 dB.

12. A chamber placed in a clean room, the chamber comprising:

a partition member provided on a floor member to surround a space which includes an original plate having a pattern, a projection optical system which transfers the pattern on the original plate onto a substrate by exposure light, and substrate stage that holds the substrate, and a vibration-reducing member including a honeycomb structural plate, wherein the vibration-reducing member is connected to the partition member to prevent the transmission of vibrations generated in the clean room to the space.

13. The chamber according to claim 12, wherein the chamber is equipped with an illumination optical system which illuminates the original plate with an exposure light and a light source which emits the exposure light.

14. The chamber according to claim 13, wherein the honeycomb structural plate comprises an aggregate of cells each having a cross section of a polygonal shape.

15. The chamber according to claim 13, wherein the honeycomb structural plate comprises an aggregate of cells each having a cross section of a hexagonal shape.

16. A chamber according to claim 12, wherein said honeycomb structure plate is formed of aluminum alloy or ceramic material.

17. An apparatus according to claim 12, wherein said vibration arises as a result of a noise produced by an external apparatus installed on the exterior of said chamber, and said chamber attenuates the noise.

18. An apparatus according to claim 17, wherein said external apparatus is at least one of the following:

(a) an air-conditioning apparatus that controls the environment in said clean room; and (b) a duct connected to an air-conditioning apparatus.

19. A chamber according to claim 12, wherein the partition member includes a first plate member which forms the interior surface of the chamber, a second plate member which forms the exterior surface of the chamber, wherein the vibration-reducing member is disposed between the first plate member and the second plate member.

* * * * *